United States Patent
Yasoshima et al.

[11] Patent Number: 5,847,666
[45] Date of Patent: Dec. 8, 1998

[54] DATA TRANSMITTER AND METHOD OBJECT CODE GENERATOR AND METHOD DIGITAL SIGNAL PROCESSOR AND CODE GENERATOR AND METHOD

[75] Inventors: Hiroyuki Yasoshima; Katsuhiko Ueda, both of Osaka, Japan

[73] Assignee: Matsushita Electric Industrial Co., Ltd., Osaka, Japan

[21] Appl. No.: 664,214

[22] Filed: Jun. 11, 1996

[30] Foreign Application Priority Data

Jun. 15, 1995 [JP] Japan ................................ 7-149071

[51] Int. Cl.[6] ...................................................... H03M 7/00
[52] U.S. Cl. ................................................. 341/58; 341/50
[58] Field of Search .................................. 341/50, 58, 95

[56] References Cited

U.S. PATENT DOCUMENTS

| 5,572,736 | 11/1996 | Curran | 395/750 |
| 5,574,921 | 11/1996 | Curran | 395/750 |

FOREIGN PATENT DOCUMENTS

| 02-310762 | 12/1990 | Japan . |
| 05-135187 | 6/1993 | Japan . |

*Primary Examiner*—Marc S. Hoff
*Attorney, Agent, or Firm*—McDermott, Will & Emery

[57] ABSTRACT

This invention provides a code generator for reduction of the power consumption of digital signal processors. A plurality of codes are prepared for an item of data. A code with the lowest polarity-inverting bit count for input data, is selected from among the prepared codes. The code generator of the present invention has a code generation section, a code selection section and a code output section. The code generation section inputs data from a data file and generates all codes allocated to the input data. The code selection section makes a comparison between each of the generated codes and a code that is transferred just before or after any one of the generated codes is transferred over a bus of the digital signal processor, in order to select from among the generated codes a code having the lowest polarity-inverting bit count. The code output section writes the selected code into a code file. In addition, the code output section temporarily holds the selected code and outputs it to the code selection section as a comparison target code used to select the next code.

44 Claims, 24 Drawing Sheets

Fig. 1

| DATA | CODE | | |
|---|---|---|---|
| A | 000 | 110 | |
| B | 001 | | |
| C | 010 | | |
| D | 011 | | |
| E | 100 | 101 | 111 |

Fig. 3
(PRIOR ART)

| n \ n+1 | A<br>000 | B<br>001 | C<br>010 | D<br>011 | E<br>100 |
|---|---|---|---|---|---|
| A 000 | 0 | 1 | 1 | 2 | 1 |
| B 001 | 1 | 0 | 2 | 1 | 2 |
| C 010 | 1 | 2 | 0 | 1 | 2 |
| D 011 | 2 | 1 | 1 | 0 | 3 |
| E 100 | 1 | 2 | 2 | 3 | 0 |

AVERAGE 1.28

Fig. 4

| n \ n+1 | A 000 | A 110 | B 001 | C 010 | D 011 | E 100 | E 101 | E 111 |
|---|---|---|---|---|---|---|---|---|
| A 000 | 0/2 |  | 1/2 | 1/2 | 2/2 | 1/2 |  |  |
| A 110 |  | 0/2 | 3/2 | 1/2 | 2/2 | 1/2 |  |  |
| B 001 | 1 |  | 0 | 2 | 1 |  | 1 |  |
| C 010 | 1 |  | 2 | 0 | 1 | 2 |  |  |
| D 011 | 2 |  | 1 | 1 | 0 |  |  | 1 |
| E 100 | 1/3 |  | 2/3 | 2/3 | 3/3 | 0/3 |  |  |
| E 101 | 2/3 |  | 1/3 | 3/3 | 2/3 |  | 0/3 |  |
| E 111 |  | 1/3 | 2/3 | 2/3 | 1/3 |  |  | 0/3 |

AVERAGE 1.17

Fig. 5

| n \ n+1 | A 000 | B 001 | C 010 | D 011 | E 100 |
|---|---|---|---|---|---|
| A 000 | 0 | 1 | 1 | 2 | 1×2 |
| B 001 | 1 | 0 | 2 | 1 | 2×2 |
| C 010 | 1 | 2 | 0 | 1 | 2×2 |
| D 011 | 2 | 1 | 1 | 0 | 3×2 |
| E 100 | 1×2 | 2×2 | 2×2 | 3×2 | 0×2 |

AVERAGE 1.33

Fig. 6

| n+1 \ n | A 000 | A 110 | B 001 | C 010 | D 011 | E 100 | E 101 | E 111 |
|---|---|---|---|---|---|---|---|---|
| A000 | 0/2 |  | 1/2 | 1/2 | 2/2 | 1/2×2 |  |  |
| A110 |  | 0/2 | 3/2 | 1/2 | 2/2 | 1/2×2 |  |  |
| B001 | 1 |  | 0 | 2 | 1 |  | 1×2 |  |
| C010 | 1 |  | 2 | 0 | 1 | 2×2 |  |  |
| D011 | 2 |  | 1 | 1 | 0 | 0/3×2 |  |  |
| E100 | 1/3×2 |  | 2/3×2 | 2/3×2 | 3/3×2 |  | 0/3×2 |  |
| E101 | 2/3×2 |  | 1/3×2 | 3/3×2 | 2/3×2 |  |  | 1×2 |
| E111 |  | 1/3×2 | 2/3×2 | 2/3×2 | 1/3×2 |  | 0/3×2 | 0/3×2 |

AVERAGE 1.16

Fig. 7

|  |  | CODE STRING | | OUTPUT CODE |
|---|---|---|---|---|
|  |  | CANDIDATE1 | CANDIDATE2 | |
| DATA | C | 010 | 010 | 010 |
|  | A | 000  1 | 110  1 | 000 |
|  | B | 001  1 | 001  3 | 001 |
| PIB COUNT | | 2 | 4 | |

| DATA | FIRST CODE | SECOND CODE |
|---|---|---|
| B | 001 | 001 |
| E | 101 | 100 |
| A | 000 | 000 |
| E | 100 | 100 |

POLARITY-INVERTING BIT COUNT

Fig. 9

| DATA | CODE | |
|------|------|------|
| A | 000 | 111 |
| B | 001 | 110 |
| C | 010 | 101 |
| D | 011 | 100 |

Fig. 10
(PRIOR ART)

| INSTRUCTION | OPERATION PART (3bit) | OPERAND PART (5bit) |
|---|---|---|
| WRITE (STR) | 000 | 00000 ≀ 11111 |
| READ (LD) | 001 | 00000 ≀ 11111 |
| ADDITION (ADD) | 010 | 00000 ≀ 11111 |
| SUBTRACTION (SUB) | 011 | 00000 ≀ 11111 |
| CONDITIONAL BRANCH (JMP) | 100 | 00000 ≀ 11111 |
| BLANK | 101 ≀ 111 | 00000 ≀ 11111 |

Fig. 11(a)

| INSTRUCTION | OPERATION PART (3bit) | OPERAND PART (6bit) |
|---|---|---|
| WRITE (STR) | 000<br>111 | 000000<br>≀<br>111111 |
| READ (LD) | 001<br>110 | 000000<br>≀<br>111111 |
| ADDITION (ADD) | 010<br>101 | 000000<br>≀<br>111111 |
| SUBTRACTION (SUB) | 011 | 000000<br>≀<br>111111 |
| CONDITIONAL BRANCH (JMP) | 100 | 000000<br>≀<br>111111 |

Fig. 11(b)

| MEMORY ADDRESS | OPERAND PART |
|---|---|
| 00000 | 000000<br>111111 |
| 00001 | 000001<br>111110 |
| 00010 | 000010<br>111101 |
| 00011 | 000011<br>111100 |
| ≀ | ≀ |
| 11100 | 011100<br>100011 |
| 11101 | 011101<br>100010 |
| 11110 | 011110<br>100001 |
| 11111 | 011111<br>100000 |

Fig. 13

| INSTRUCTION | OBJECT CODE CANDIDATE | COMPARISON CODE | PIB COUNT | OUTPUT OBJECT CODE | PIB COUNT |
|---|---|---|---|---|---|
| JMP 7 | | | | 100-000111 | |
| ADD 4 | 010-000100<br>010-111011<br>101-000100<br>101-111011 | 100-000111 | 4<br>6<br>③<br>5 | 101-000100 | 3 |
| STR 31 | 000-011111<br>000-100000<br>111-011111<br>111-100000 | 101-000100 | 6<br>4<br>5<br>③ | 111-100000 | 3 |
| | | | | PIB COUNT TOTAL | 6 |

Fig. 14

| INSTRUCTION | OBJECT CODE CANDIDATE | COMPARISON CODE | PIB COUNT | OUTPUT OBJECT CODE | PIB COUNT |
|---|---|---|---|---|---|
| JMP 7 | | | | 100-00111 | |
| ADD 4 | 010-00100 | 100-00111 | 4 | 010-00100 | 4 |
| STR 31 | 000-11111 | 010-00100 | 6 | 000-11111 | 6 |
| | | | | PIB COUNT TOTAL | 1 0 |

Fig. 16(a)

| INSTRUCTION | CODE | |
|---|---|---|
| LOAD | 00000 | |
| ADD | 11000 | 00100 |
| CMP | 11001 | 00011 |
| JMP | 11111 | |

Fig. 16(b)

| INSTRUCTION STRING | CODE STRING | | | |
|---|---|---|---|---|
| ADD | 11000 | 11000 | 00100 | 00100 |
| CMP | 11001 | 00011 | 11001 | 00011 |
| JMP | 11111 | 11111 | 11111 | 11111 |

Fig. 16(c)

| INSTRUCTION STRING | CODE STRING | | | | |
|---|---|---|---|---|---|
| LOAD | 00000 | 00000 | 00000 | 00000 | CODES OUTPUTTED AT PRECEDING CYCLE |
| ADD | 11000 | 11000 | 00100 | 00100 | |
|  | 2 | 2 | 1 | 1 | POLARITY-INVERTING BIT COUNT |
| CMP | 11001 | 00011 | 11001 | 00011 | |
|  | 2+1=3 | 2+4=6 | 1+4=5 | 1+3=4 | POLARITY-INVERTING BIT COUNT |
| JMP | 11111 | 11111 | 11111 | 11111 | |
|  | 3+2=5 | 6+3=9 | 5+2=7 | 4+3=7 | POLARITY-INVERTING BIT COUNT |

ADDRESS INSTRUCTION COMMENT 0400 add a, b    ;a=a+b
0401 cmp a, c    ;a-c
0402 brp 405     ;if(a-c>=0)then goto 405
0403 add c, c    ;c=c+c
0404 br 401      ;goto 401
0405 mov a, c    ;a=c

PROGRAM FLOW

Fig. 21(a)

MERGE FORECASTING TABLE

| CURRENT ADDRESS | PRECEDENCE ADDRESS |
|---|---|
| 0400 | 0399 |
| 0401 | 0400  0404 |
| 0402 | 0401 |
| 0403 | 0402 |
| 0404 | 0403 |
| 0405 | 0404 |
| 0406 | 0405 |
| ⋮ | ⋮ |

Fig. 21(b)

BRANCH CODE TABLE

| ADDRESS | CODE |
|---|---|
| 0402 | 100-0100-0000-0101 |
| 0404 | 100-0100-0000-0001 |
| ⋮ | ⋮ |

Fig. 23

| INPUT CODE | CONDITION FLAG | OUTPUT SIGNAL | | | | | OUTPUT DATA MEMORY ADDRESS | |
|---|---|---|---|---|---|---|---|---|
| | | STR | LD | ADD | SUB | JMP | a=0 | a=1 |
| 000-abcdef | 0/1 | 1 | 0 | 0 | 0 | 0 | bcdef | $\overline{bcdef}$ |
| 001-abcdef | 0/1 | 0 | 1 | 0 | 0 | 0 | bcdef | $\overline{bcdef}$ |
| 010-abcdef | 0/1 | 0 | 0 | 1 | 0 | 0 | bcdef | $\overline{bcdef}$ |
| 011-abcdef | 0/1 | 0 | 0 | 0 | 1 | 0 | bcdef | $\overline{bcdef}$ |
| 100-abcdef | 0 | 0 | 0 | 0 | 0 | 0 | bcdef | $\overline{bcdef}$ |
| 100-abcdef | 1 | 0 | 0 | 0 | 0 | 1 | bcdef | $\overline{bcdef}$ |
| 101-abcdef | 0/1 | 0 | 0 | 1 | 0 | 0 | bcdef | $\overline{bcdef}$ |
| 110-abcdef | 0/1 | 0 | 1 | 0 | 0 | 0 | bcdef | $\overline{bcdef}$ |
| 111-abcdef | 0/1 | 1 | 0 | 0 | 0 | 0 | bcdef | $\overline{bcdef}$ |

$\overline{bcdef}$=bcdef´S LOGICAL INVERSION

DATA TRANSMITTER AND METHOD OBJECT CODE GENERATOR AND METHOD DIGITAL SIGNAL PROCESSOR AND CODE GENERATOR AND METHOD

BACKGROUND OF THE INVENTION

This invention relates to a data transmission device and method for the realization of low-power devices containing digital signal processors such as personal computers, pagers, portable telephones and video cameras. This invention also relates to a low-power digital signal processor. This invention further relates to an object code generator and method for reduction of the power consumption of digital signal processors. This invention further relates to a code generator and method.

Recently, the use of portable devices (i.e., note-type personal computers and portable telephones) has been spread widely. Therefore, low-power digital signal processors, composed of various circuits such as microprocessors, digital signal processors and memories, are in great demand. To meet the demand, various approaches have been made to reduce the drive voltage of each of these circuits.

It has been known that, generally, the power consumption of CMOS circuits forming a digital signal processor is proportional to the number of polarity-inversion (PI) occurrences in a signal line per unit time. In order to achieve reduction of the device power consumption, there have been proposed various approaches to reduce the number of such occurrences, especially in a bus.

A conventional way of reducing the number of PI occurrences in a bus line, is shown in Japanese Patent Application Pub. No. 5-135187. For example, in a digital signal processor comprising a plurality of digital signal processing circuits interconnected by a bus used for the transfer of digital signals, a code conversion circuit is connected between the bus and a digital signal processing circuit. This code conversion circuit operates to convert a digital signal into a code in order that the humming distance is reduced according to its statistical characteristic, whereupon the number of PI occurrences is reduced.

Another conventional way of reducing the number of PI occurrences is shown in Japanese Patent Application Pub. No. 2-310762. When an LSI provides data onto a bus line, a polarity-inversion bit counter, arranged in an LSI data output section, compares the data with its preceding data, to count the number of PI occurrences between bits of the data and corresponding bits of the preceding data. Thereafter, based on the result of the counting operation, the bit counter determines whether the data is to be outputted having a polarity of positive logic or a polarity of negative logic, thereafter providing a signal indicative of the polarity of the data together with the data itself, for reducing the polarity-inversion count.

However, the above-described prior art techniques have their respective problems that additional circuits, i.e., the code conversion circuit and the polarity-inversion bit counter, are required. These circuits dissipate additional extra power, so that even if the number of PI occurrences in a bus is reduced this will not much contribute to cutting down the power consumption.

Another problem is that in a fast circuit a signal delay occurs in an additional circuit, therefore complicating the design of timing.

Still another problem is that, since there are provided fixed rules for code conversion (for example, it is fixed that the humming distance is reduced), this results in the lack of flexibility to, for example, bus configuration variations.

SUMMARY OF THE INVENTION

Bearing in mind the above-noted problems associated with the prior art techniques, this invention was made. Accordingly it is an object of the present invention to provide a data transmission device and its associated data transmission method for the conversion of data into a code in order that the power consumption of digital signal processors is significantly reduced.

It is another object of the present invention to provide an object code generator and its associated object code generation method for the conversion of an instruction in a program into an object code in order that the power consumption of digital signal processors is significantly reduced.

It is still another object of the present invention to provide a digital signal processor in which either an instruction or data is coded for reduction of the number of PI occurrences in a bus.

It is a further object of the present invention to provide a code generator and its associated code generation method for the conversion of data into a code in order that the power consumption of digital signal processor is significantly reduced.

The present invention is described more specifically. Each data to be processed by a digital signal processor is allocated a plurality of codes. Of these allocated codes, a code is selected in such a way as to reduce the number of PI occurrences in a bus of the digital signal processor to a minimum. The digital signal processor has a decoder with a function of interpreting a plurality of codes allocated to an item of data as the data item.

Both a code allocation method and a code selection method according to the present invention are described using an example case where five items of data, "A", "B", "C", "D", "E" are used and each data is allocated a code of three bits.

FIG. 1 shows an example of the code allocation method of the present invention. In a conventional code application method, DATA "A", "B", "C", "D" and "E" are allocated CODES [000], [001], [010], [011] and [100], respectively. In the present invention, however, not only an item of data is allocated a single code, but also an extra free code or more are allocated in multiple to each data. In FIG. 1, of the free codes, CODE [110] is allocated to DATA "A" and CODES [101] and [111] are allocated to DATA "E".

The code selection method is now described. Suppose here that the nth data is DATA "D" and the (n+1)th data is DATA "E". DATA "D" is allocated CODE [011]. DATA "E" is allocated three codes, CODES [100], [101] and [111], from among which one code must be chosen for DATA "E". Such selection is made as follows. Each bit of CODE [011] is compared with a corresponding bit of each CODE [100], [101], [111], in order to find the number of occurrences of the bit polarity change from "0" to "1" or from "1" to "0" (i.e., the polarity-inverting bit (PIB) count). Of these three codes allocated to DATA "E", one with the lowest PIB count is selected. More specifically, the PIB count is three (3) when CODE [100] is provided after CODE [011], two (2) when CODE [101] is provided after CODE [011], and one (1) when CODE [111] is provided after [011]. Therefore, CODE [111], since it has the lowest PIB count, is selected as a code for DATA "E".

If a code, selected in the above-described manner, is sequentially transferred over the bus, this reduces the number of PI occurrences in a bit line of the bus. As a result, the power consumption of the digital signal processor is reduced.

BRIEF DESCRIPTION OF THE DRAWINGS

FIG. 1 is a diagram illustrating an example of a code allocation method of the present invention.

FIG. 3 is a table showing PIB (polarity-inverting bit) counts in a code allocation method in accordance with a conventional technique.

FIG. 4 is a table showing PIB counts in a code allocation method in accordance with the present invention.

FIG. 5 is a table showing PIB counts in a code allocation method in accordance with a conventional technique.

FIG. 6 is a table showing PIB counts in a code allocation method in accordance with the present invention.

FIG. 7 is a diagram useful in understanding a code selection method of the present invention.

FIG. 9 is a diagram showing another code allocation method of the present invention.

FIG. 10 is a diagram showing an object code allocation method in accordance with a conventional technique.

FIG. 11, comprised of 11(a) and (b), shows an object code allocation method in accordance with the present invention.

FIG. 13 is a diagram useful in understanding the operation of an object code generator made in accordance with the second embodiment of the present invention.

FIG. 14 is a diagram useful in understanding the operation of an object code generator made in accordance with a conventional technique.

FIG. 16, comprised of 16(a)–(c), is a diagram useful in understanding the operation of an object code generator made in accordance with the second embodiment.

FIG. 21(a) shows a merge forecasting table for the FIG. 17 assembler program and FIG. 21(b) shows a branch code table for the FIG. 17 assembler program.

FIG. 23 is a table showing output signals from an instruction decoder of a digital signal processor of the fourth embodiment.

DETAILED DESCRIPTION OF THE INVENTION

EMBODIMENT 1

Figure 2:
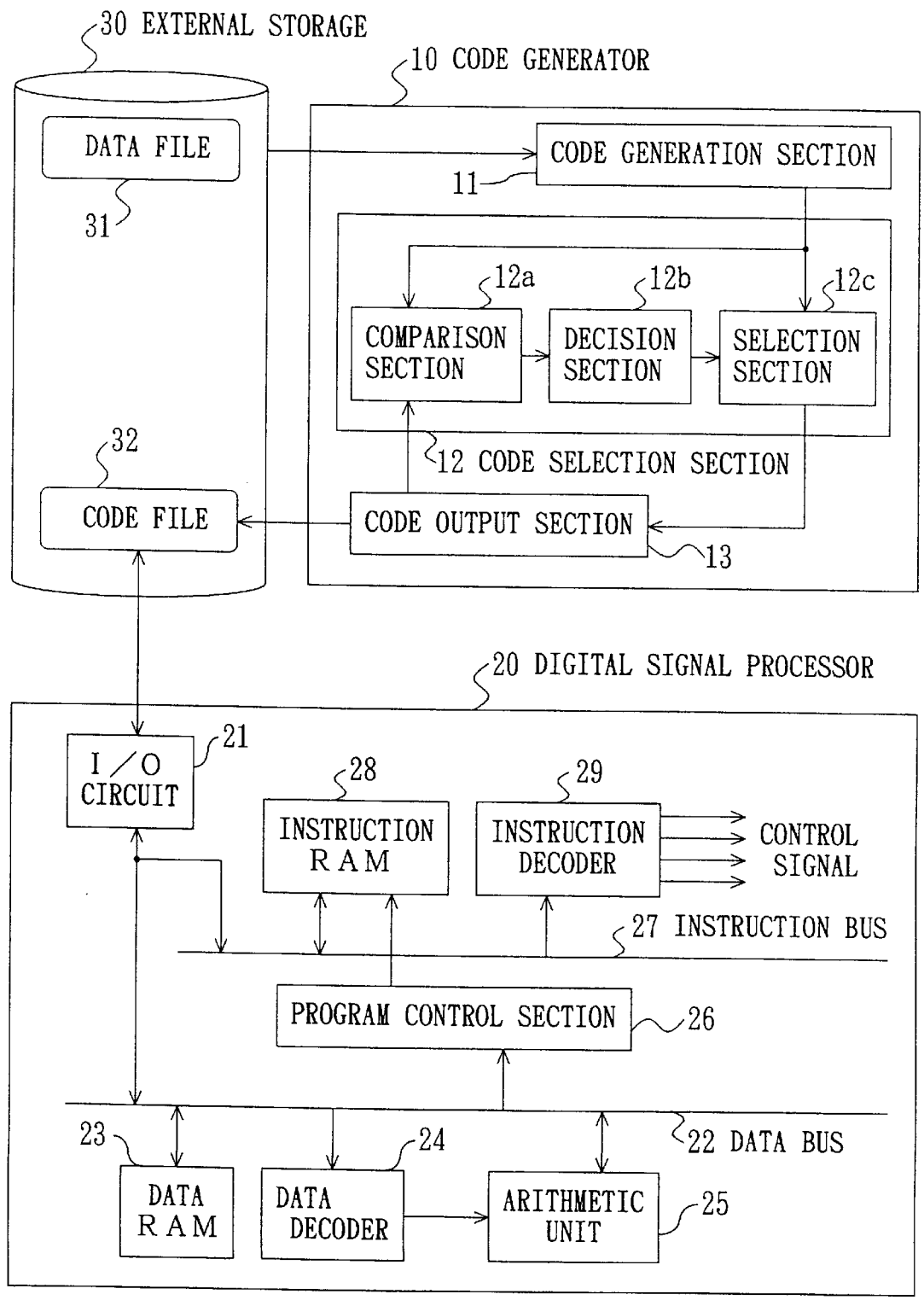
FIG. 2 is a block diagram depicting a structure of a data transmission device of the present invention.

Referring now to FIG. 2, the structure of a data transmission device of this invention is described. 10 is a code generator. 20 is a digital signal processor. 30 is an external storage. This external storage 30 stores various files including a data file 31 and a code file 32.

The code generator 10 has a code generation section 11, a code selection section 12 and a code output section 13. The code selection section 12 comprises a comparison section 12a, a decision section 12b and a selection section 12c.

The code generation section 11 inputs data from the data file 31 and outputs all codes allocated to the input data. The comparison section 12a makes a comparison in polarity between (A) a code temporarily stored in the code output section 13 and already written into the code file 32 and (B) each of the codes outputted from the code generation section 11. Thereafter, for each of the codes from the code generation 11, the comparison section 12a outputs a respective result of the comparison operation indicative of the number of bits which make a polarity inversion (hereinafter called the polarity-inverting bit (PIB) count). Based on the output from the comparison section 12a, the decision section 12b determines a code with the lowest PIB count, thereafter sending out a signal indicative of that code. In response to the signal from the decision section 12b, the selection section 12c selects from among all the codes outputted from the code generation section 11 a code with the lowest PIB count, thereafter outputting the selected code. This code is written by the code output section 13 into the code file 32 and at the same time is temporarily held in the code output section 13 to be transferred to the comparison section 12a at the time of generating a code for the next data.

The concept of data to be dealt with in the code generator 10 is broad. In the code generator 10, in addition to character data and numeric value data, program instructions are also dealt with. For the sake of simplicity of the description, character data, shown in FIG. 1, are coded in the present embodiment. Cases of dealing with program instructions are explained later in the second embodiment of this invention.

The digital signal processor 20 has an input/output (I/O) circuit 21, a data bus 22, a data RAM 23, a data decoder 24, an arithmetic unit 25, a program control section 26, an instruction bus 27, an instruction RAM 28 and an instruction decoder 29.

The I/O circuit 21 transmits onto the data bus 22 a data code received from the code file 32 of the external storage 30 and writes the data code into the code file 32. In addition to these functions, the I/O circuit 21 transmits a coded program onto the instruction bus 27. The data RAM 23 stores data that is processed in the digital signal processor 20. The data decoder 24 decodes a data code on the data bus 22 and outputs the data thus decoded to the arithmetic unit 25. The arithmetic unit 25 inputs either a data code on the data bus 22 or data from the data decoder 24 and outputs a result of the arithmetic operation onto the data bus 22. The instruction RAM 28 stores an object code indicative of a process in the digital signal processor 20. The instruction decoder 29 decodes an object code on the instruction bus 27 and sends out a control signal for directing each circuit.

Referring now to FIG. 2, the operation of the data transmission device shown in FIG. 2 is described. Suppose here that the FIG. 1 codes are prepared in the code generation section 11, that DATA "C", "D" and "E" are stored in that order in the data file 31 and that DATA "C" is already converted into CODE [010] and has been stored in the code file 32.

The code generation section 11 inputs DATA "D" from the data file 31 and outputs CODE [011]. The code generation section 11 generates only one code, CODE [011]. Therefore, this code is outputted intact to the code output section 13 from the selection section 12. This CODE [011] is stored by the code output section 13 in the code file 32 and is temporarily held in the code output section 13.

Next, the code generation section 11 inputs DATA "E" from the data file 31 and outputs three CODES [100], [101] and [111]. Since in this case the code generation section 11 outputs a plurality of CODES, the comparison section 12a inputs CODE [011] held in the code output section 13. Then, the comparison section 12a makes a comparison between CODE [011] and each CODE [100], [101], [111], to calculate respective PIB counts. In this case, the PIB count of CODE [100] against CODE [011] is three. The PIB count of CODE [101] against CODE [011] is two. The PIB count of CODE [111] against CODE [011] is one. Based on the result of the calculation operation by the comparison section 12a, the decision section 12b decides that CODE [111] has the smallest PIB count. The selection section 12c selects, from among the codes generated by the code generation section 11, CODE [111] according to the instruction signal from the decision section 12b. The code output section 13 stores CODE [111] in the code file 32. CODE [111] is temporarily held in the code output section 13. As a result, CODES [010], [011] and [111] are stored in that order in the code file 32.

The codes stored in the code file 32 are recorded in the data RAM 23 of the digital signal processor 20 via the I/O circuit 21. The codes recorded in the data RAM 23 are fed to the data decoder 24 through the data bus 22. The data decoder 24 has a function of converting all codes prepared for an item of data into that data item.

The codes transmitted over the data bus 22 are preselected by the code generator 10 for reduction of the PIB count, whereupon the number of PI occurrences in the data bus 22 drops. As a result of such arrangement, the power consumption of the digital signal processor 20 can be reduced without having to provide additional circuits.

FIG. 3 is a table showing the PIB count in a code allocation method according to a prior art technique. Numeric values indicated in spaces of the table each show a respective PIB count when an (n+1)th data appears after an nth data. If the probability that each data occurs is the same, then the PIB count average value is 1.28 bits.

FIG. 4 is a table showing the PIB count in the FIG. 1 code allocation technique. Like FIG. 3, numeric values indicated in spaces of the table each show a respective PIB count when an (n+1)th data occurs after an nth data. Each blank space with no numeric value indicates that as an (n+1) data a code therefor is not selected. Suppose that the probability that individual nth data occur is the same and that the probability that individual codes of data that is allocated a plurality of codes occur is the same. For example, the probability that DATA "A" occurs and the probability that DATA "B" occurs are the same. However, since there are two codes for DATA "A", the probability that each of the two codes of DATA "A" occurs is ½ of the probability that DATA "B" occurs. Likewise, there are three codes for DATA "E", the probability that each of these three codes of DATA "E" occurs is ⅓ of the probability that DATA "B" occurs. In this case, the PIB count average value is 1.17 bits which is lower than the conventional PIB count average value (1.28 bits) by 0.11 bit.

Next, suppose that the probability that DATA "E" occurs is twice the probability that data other than DATA "E" occurs. In such a case, a conventional code allocation technique produces PIB counts shown in FIG. 5 and the average value is 1.33 bits. On the other hand, PIB counts produced by the FIG. 1 code allocation technique are shown in FIG. 6 and the average value is 1.16 bits which is lower by 0.17 bit in relation to the conventional technique.

Accordingly, when the probabilities that individual data occur are one-sided, considerable effects can be obtained by allocating more codes to data with high occurrence probability.

When a plurality of codes allocated to specific data are compared with an immediately preceding code, there may result in such a situation that their PIB counts happen to be the same. In this case, a code selection process may be performed by making a comparison with an immediately following code, which is described below.

FIG. 7 is a diagram useful in understanding a code selection technique used in the above-described case. FIG. 7 shows a case in which DATA "C", DATA "A" and DATA "B" are outputted in that order in the FIG. 1 code allocation technique.

CODE [010] is first outputted as a code for DATA "C". Next, either CODE [000] or CODE [110] is outputted as a code for DATA "A". Since both CODE [000] and CODE [110] have the same PIB count with respect to CODE [010] of one, they are temporarily held as an output candidate code. Thereafter, CODE [001], which is a code for DATA "B", is compared with each of the output candidate codes. The PIB count is one when [000] makes a transition to [001]. On the other hand, the PIB count is three when [110] makes a transition to [001]. Therefore, [000] is selected and outputted as a code for DATA "A". Then, [001], a code for DATA "B", is outputted.

In this case, the code generator 10 performs the following operations.

When there are plural codes that have the same, lowest PIB count for a certain code, the decision section 12b instructs the selection section 12c to temporarily hold all of such codes as an output candidate code. As instructed, the selection section 12c temporarily holds these candidate codes and outputs them to the comparison section 12a via the code output section 13.

When a code allocated to the next data is outputted from the code generation section 11, the comparison section 12a makes a comparison between the outputted code and each candidate code, to calculate respective PIB counts. The decision section 12b determines which of the candidate codes has the lowest PIB count. The selection section 12c selects a candidate code that is determined by the decision section 12b to have the lowest PIB count. The selected code is written into the code file 32 via the code output section 13.

FIG. 7 shows a way of determining a string of codes with the lowest PIB count from a code for the next data. However, there may exist a plurality of strings of codes having the same, lowest PIB count. To cope with such a situation, a technique may be employed in which a string of codes that contains the largest number of 0s is chosen. There is another alternative in which a further comparison is made with a code for the further next data so as to select a string of codes with the lowest PIB count.

The description up to here has been made on the condition that the number of bits to be allocated to data is equal to the number of bits of the data bus 22 of the digital signal processor 20. The data bit count may differ from the data bus bit count in some cases as described below.

Figure 8:
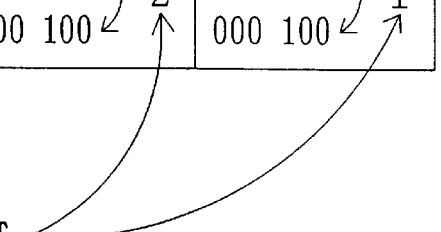
FIG. 8 is a diagram useful in understanding a case where the number of code bits and the number of data bus bits differ from each other.

FIG. 8 is a diagram that provides an understanding of such a case in the present embodiment. In FIG. 8, the number of bits of the data bus 22 is six and each data is allocated a code of three bits (see FIG. 1). If DATA "B", DATA "E", DATA "A" and DATA "E" are outputted in that order, then DATA "B,E" and DATA "A,E" are transferred over the data bus 22. In this case, to achieve reduction of the power consumption of the bus, it becomes necessary to find the PIB count not with respect to the immediately preceding data but with respect to the data ahead of that preceding data. FIG. 8 shows a first code and a second code. Whereas the first code is a string of codes generated in such a way as to have the lowest PIB count in relation to the preceding code, the second code is a string of codes generated in such a way as to have the lowest PIB count in relation to the code ahead of that preceding code. When a data change from DATA "B,E" to DATA "A,E" occurs on the data bus 22, the PIB count of the second code becomes lower than that of the first code (see FIG. 8).

In such a case, it is sufficient for the code output section 13 to perform a function of temporarily holding not only a previously outputted code but also a plurality of past codes in the code generator 10 shown in FIG. 2. This makes it possible for the comparison section 12a to make a comparison between a code outputted from the code generation section 11 and each of codes outputted in an arbitrary number from the code output section 13.

Additionally, a code allocation method other than the one shown in FIG. 1 may be used.

FIG. 9 shows a code allocation method. In this allocation method, each data is allocated two codes each of which is a code formed by placing a polarity bit indicative of the logic form (positive logic or negative logic) at the head end of a positive or negative logic bit string. For example, if there are four items of data (DATA "A", DATA "B", DATA "C", DATA "D"), then DATA "A" is allocated a code of two bits (CODE [00]), DATA "B" CODE [01], DATA "C" CODE [10] and DATA "D" CODE [11] in a conventional code allocation method. Conversely, in the present code allocation method, each data is allocated two 3-bit codes each containing a polarity bit of one bit. More specifically, DATA "A" is allocated CODES [000] and [111], DATA "B" CODES [001] and [110], DATA "C" CODES [010] and [101] and DATA "D" CODES [011] and [100].

For the case of a digital signal processor with a precharge-type bus, a code containing the largest number of is may be selected for each data.

Although in the present embodiment a code with the lowest PIB count is selected, the selection of a code with the greatest PIB count makes it possible to find a code with high testability for the load testing of digital signal processor.

EMBODIMENT 2

A second embodiment of this invention is described. In the second embodiment, an instruction of an assembler program is handled as data. In this case, a code is an objective code representing a respective instruction.

There are five types of instructions, STR (WRITE), LD (READ), ADD (ADDITION), SUB (SUBTRACTION) and JMP (CONDITIONAL BRANCH). A memory space of 32 words (=$2^5$) is assigned.

FIG. 10 shows an object code allocation in accordance with a prior art technique. A code of eight bits, of which three bits are for an operation part indicative of the type of instruction and five bits are for an operand part indicative of an object memory address, is allocated to each instruction. The number of instruction types is five and, of codes for the operation part, CODES [101], [110], [111] are idle codes.

FIG. 11(a) is a diagram showing an object code allocation in accordance with the present embodiment. As shown in FIG. 11(a), CODES [101], [110], [111], which are idle codes in a conventional allocation, are allocated in multiple to ADD, to READ and to WRITE, respectively. Six bits are allocated as an operand part. As shown in FIG. 11(b), a respective address is given two operand part codes. Whereas the low-order five bits of the operand part code is either a positive logic code or a negative logic code, the MSB is a bit indicative of the logic form (positive logic or negative logic) of the low-order five bits. For instance, OPERAND PART CODES [000010] and [111101] each represent MEMORY ADDRESS [00010].

In the FIG. 2 data transmission device, the data file 31 of the external storage 30 stores an assembler program in a text format and the code file 32 stores an object code in a binary format. An object code generator is formed by a code generator.

The code generation section 11 inputs an instruction from an assembler program stored in the data file 31 and decodes the input instruction to generate an object code. At this time, all object codes, allocated in multiple, are outputted.

The comparison section 12a makes a comparison between a code, previously outputted and held in the code output section 13 and each code outputted from the code generation section 11, to calculate and provide respective PIB counts.

The decision section 12b determines, based on the output from the comparison section 12a, determines an object code with the lowest PIB count.

Based on the result of the decision operation by the decision section 12b, the selection section 12c selects from among the object codes generated by the code generation section 11 an object code.

The code output section 13 writes the object code thus selected by the selection section 12c into the code file 32 and this selected object code is stored also in the code output section 13.

Figure 12:
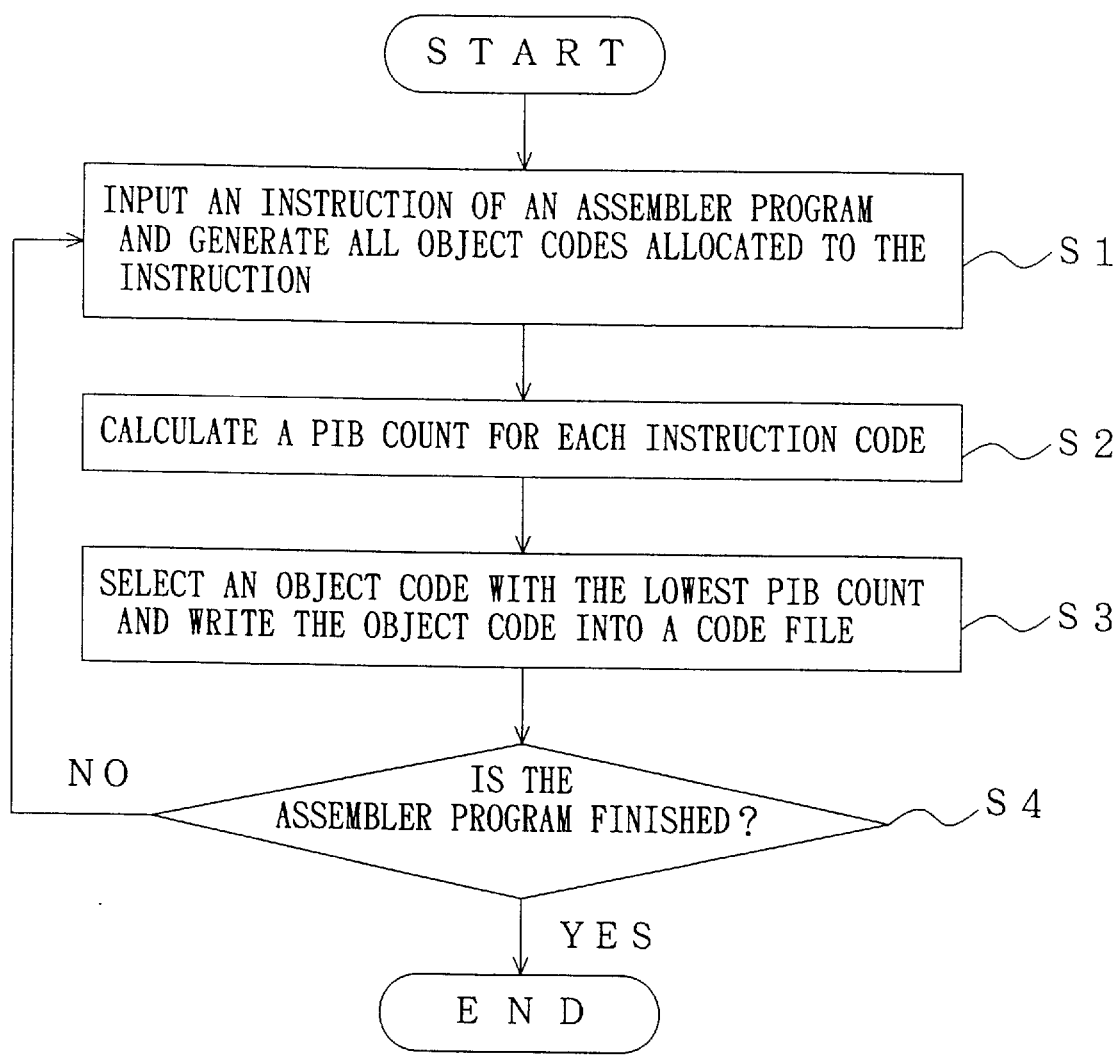
FIG. 12 is a flowchart diagram showing the operation of an object code generator made in accordance with a second embodiment of the present invention.

Referring now to FIG. 12, the operation of an object code generator of the present embodiment is explained.

At step S1, an instruction is read in from an assembler program and all object codes, allocated to this read-in instruction, are generated. At step S2, a comparison is made between a previously outputted object code and each code generated at step S1, to calculate a respective PIB count. At step S3, an object code with the lowest PIB count is selected to be written into the code file 32.

Step S4 determines whether all the instructions of the assembler program have been coded. If step S4 decides that the coding of all the instructions has been completed, then the processing ends. If some instructions still remain uncoded, then the processing returns back to step S1.

The above-described procedure is explained through example. FIG. 13 is a diagram for describing the operation of the object code generator when INSTRUCTION JMP7, INSTRUCTION ADD4 and INSTRUCTION STR31 are coded in that order (JMP7→ADD4→STR31). Suppose that INSTRUCTION JMP7 has already been coded to [100-000111].

At step S1, four object codes ([010-000100], [010-111011], [101-000100], [101-111011]), which have been allocated to INSTRUCTION ADD4, are generated. At step S4, [100-000111], which is an object code for INSTRUCTION JMP7, is compared with each of [010-000100], [010-

111011], [101-000100], [101-111011], to calculate respective PIB counts. More specifically, a comparison between [100-000111] and [010-000100] produces a PIB count of four (4). A comparison between [100-000111] and [010-111011] produces a PIB count of six (6). A comparison between [100-000111] and [101-000100] produces a PIB count of three (3). A comparison between [100-000111] and [101-111011] produces a PIB count of five (5).

At step S3, [101-000100], which produces the lowest PIB count for INSTRUCTION's JMP7 object code, is selected to be written into the code file 32. At the time of selecting an object code for INSTRUCTION STR31, [101-000100], selected for INSTRUCTION ADD4, becomes a comparison target.

As a result, the PIB count totals up to six (6) when INSTRUCTIONS ADD4 and STR31 are coded following INSTRUCTION JMP7.

Referring now to FIG. 14, the operation of a conventional object code generator is described. An example is shown in which, like FIG. 13, INSTRUCTION JMP7 is first coded which is followed by the coding of INSTRUCTIONS ADD4 and STR31. INSTRUCTION JMP7 is coded to [100-00111], INSTRUCTION ADD4 to [010-00100] and INSTRUCTION STR31 to [000-11111]. As a result of such coding, the PIB count totals up to ten (10). Therefore, the present embodiment provides the advantage that the total number of PIB counts is considerably reduced as compared with the prior art technique.

The object codes stored in the code file 32 are recorded in the instruction RAM 28 of the digital signal processor 20 through the I/O circuit 21. The object codes thus recorded in the instruction RAM 28 are fed one after another to the instruction decoder 29 by way of the instruction bus 27. The instruction decoder 29 performs the function of interpreting all object codes prepared for an instruction as the instruction.

The codes transmitted over the instruction bus 27 are pre-selected by the code generator 10 for reduction of the PIB count, whereupon the number of PI occurrences in the instruction bus 27 decreases. As a result of such arrangement, the power consumption of the digital signal processor 20 can be reduced without having to provide additional circuits.

Figure 15:
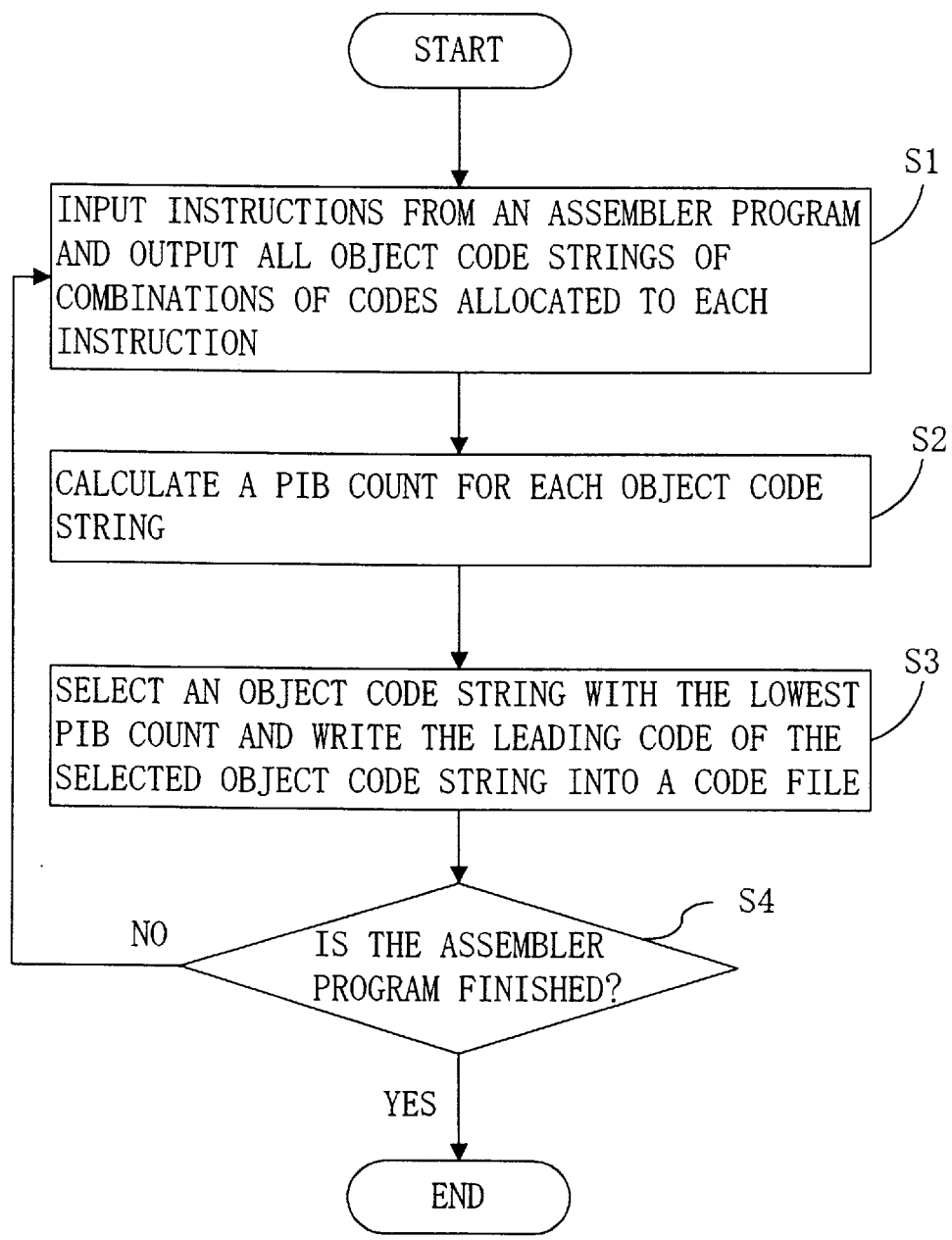
FIG. 15 is a flowchart diagram showing the operation of an object code generator in accordance with the second embodiment.

Code selection may be made by means of decision by code string. Referring now to FIG. 15, the operation of an object code generator, when a code selection is made by means of decision by code string, is explained.

At step S1, a plurality of instructions are read in from an assembler program and all object codes allocated to each instruction are generated. At step S2, a comparison is made between the previously outputted object code and each of the object codes generated at step S1, to calculate respective PIB counts. At step S3, an object code with the lowest PIB count is selected to be written into the code file 32.

Step S4 determines whether every instruction of the assembler program has been coded. If the coding of all the instructions has been completed, then the processing ends. If not, the processing returns back to step S1.

FIG. 16 is a diagram showing the FIG. 15 operation. Each instruction of an assembler program is allocated an instruction code as shown in FIG. 16(a). If INSTRUCTIONS ADD, CMP and JMP are provided in the form of a string of codes, then four types of code strings are obtained as shown in FIG. 16(b). Suppose that the preceding cycle provides CODE [00000] (INSTRUCTION LOAD). In this case, the PIB counts of the code strings are calculated as shown in FIG. 16(c). Of the four code strings, a code string composed of CODES [11000], [11001], [11111] has the lowest PIB count. Therefore, the first of this code string (i.e., CODE [11000]) is written into the code file 32 as a code corresponding to INSTRUCTION ADD.

The present invention may be applied to either one of data and instruction, or to both of them in the FIG. 2 data transmission device.

EMBODIMENT 3

Figure 17:
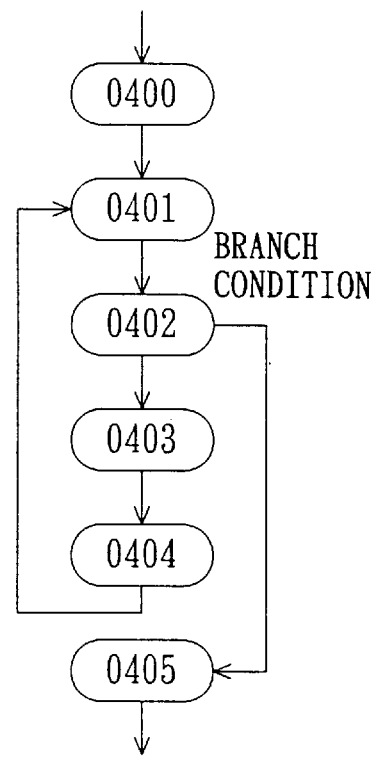
FIG. 17 shows an example of an assembler program.

An actual program includes a branch instruction. Accordingly, instructions of a program are not always executed in order of addresses. FIG. 17 shows an example of an assembler program. For example, an instruction at ADDRESS #405 is executed after an instruction at ADDRESS #402. The number of PI occurrences in an instruction bus of the digital signal processor can further be reduced as follows. An execution order of instructions is found by analyzing a program flow, and, based on the instruction execution order thus found, an object code with the lowest PIB count is selected.

Figure 18:
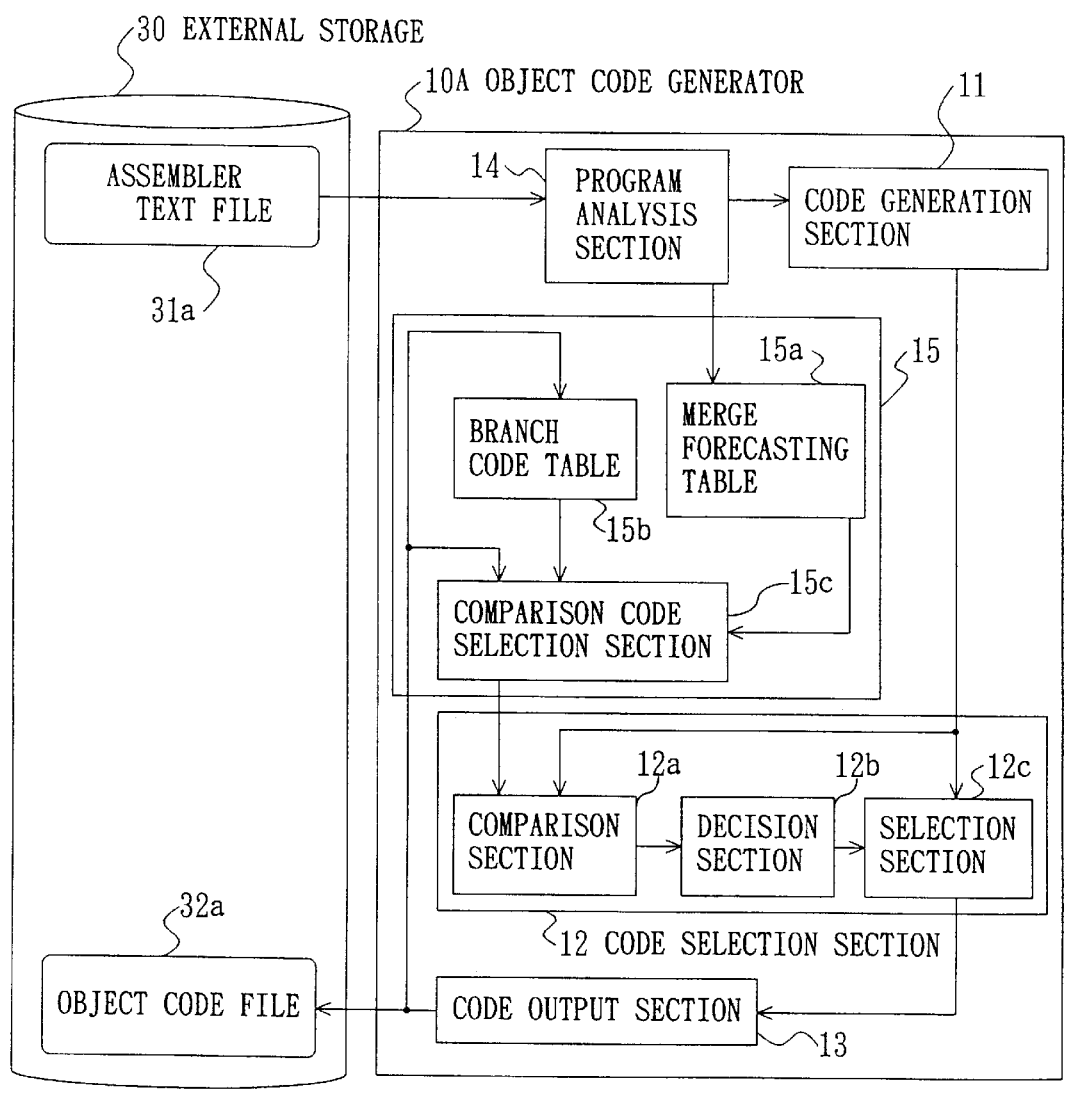
FIG. 18 is a block diagram showing a structure of an object code generator made in accordance with a third embodiment of the present invention.

FIG. 18 shows in block form a structure of an object code generator made in accordance with the present embodiment. This object code generator 10A is formed by adding to the code generator 10 of FIG. 2 the following components: a program analysis section 14; a merge forecasting table 15a; a branch code table 15b; and a comparison code selection section (CCSS) 15c. 15 is a comparison target code selection section (CTCSS). This CTCSS 15 is made up of the merge forecasting table 15a, the branch code table 15b and the CCSS 15c. The external storage 30 stores an assembler text file 31a of the data file 31 and an object code file 32a of the code file 32.

The program analysis section 14 analyzes the flow of instructions in an assembler program received from the assembler text file 31a and the result of the instruction flow analysis by the program analysis section 14 is fed to the code generation section 11 and to the merge forecasting table 15a. According to the analysis result, the code generation section 11 sequentially outputs an object code corresponding to each instruction, to the comparison section 12a and to the selection section 12c.

According to the analysis result found by the program analysis section 14, the merge forecasting table 15a applies to the CCSS 15c a signal indicative of a comparison target code. The branch code table 15b inputs from the code output section 13 an object code as a result of converting a branch instruction described in the assembler program and stores the input object code. The CCSS 15c selects, as a comparison target code, either one of an object code from the code output section 13 and an object code from the branch code table 15b, according to the signal from the merge forecasting table 15a and provides the selected object code to the comparison section 12a.

The comparison section 12a makes a comparison between an object code from the CCSS 15c (i.e., a comparison target code) and each object code from the code generation section 11, to calculate respective PIB counts. The decision section 12b determines an object code with the lowest PIB count according to the output from the comparison section 12a and provides a signal indicative of the object code. According to the signal from the decision section 12b, the selection section 12c selects, from among all the object codes provided from the code generation section 11, an object code having the lowest PIB count.

The code output section 13 supplies to the object code file 32a and to the branch code table 15b the object code received from the selection section 12c, and the object code is also held temporarily in the code output section 13.

Figure 19:
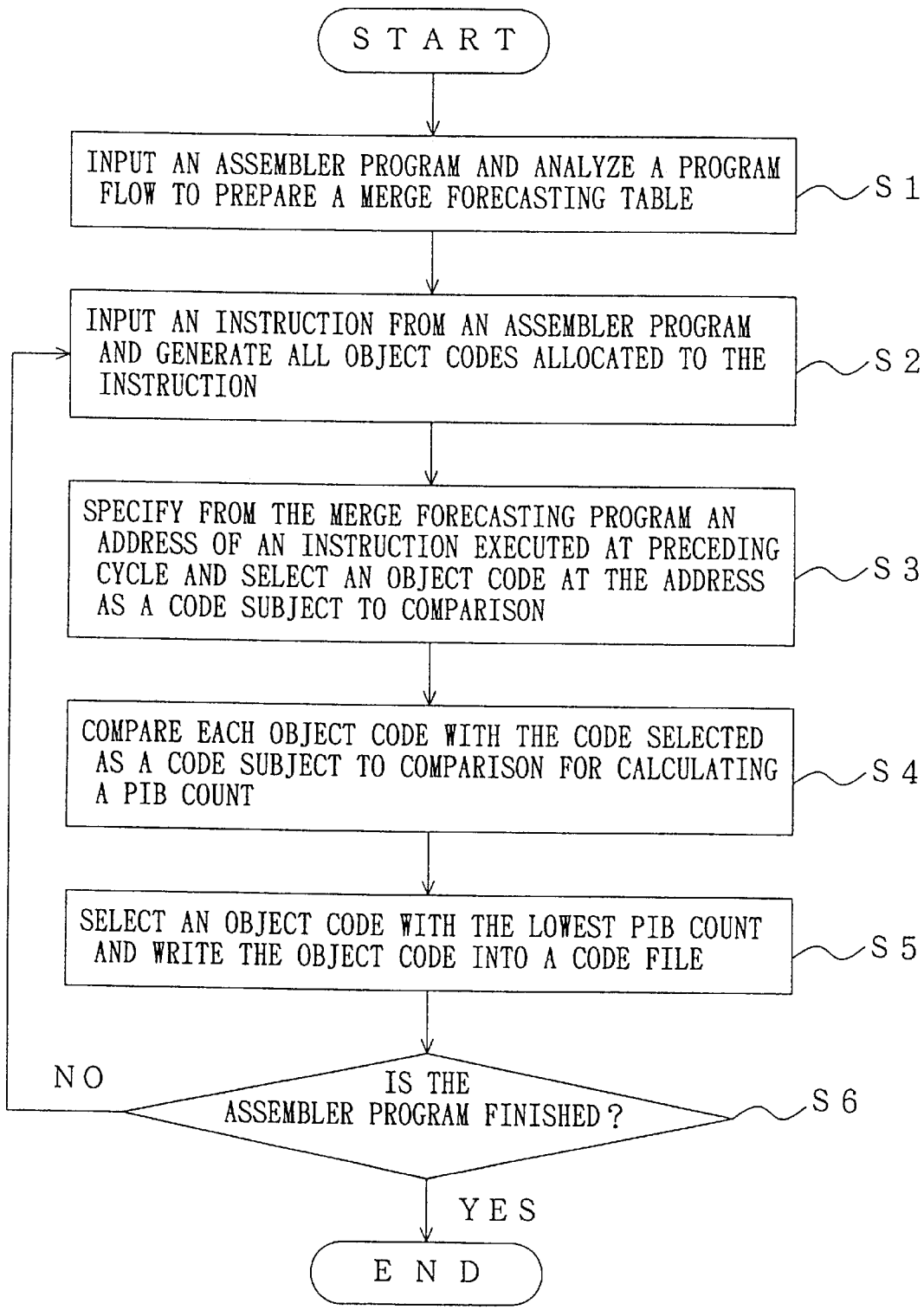
FIG. 19 is a flowchart diagram showing the operation of an object code generator made in accordance with the third embodiment.
Figure 20:
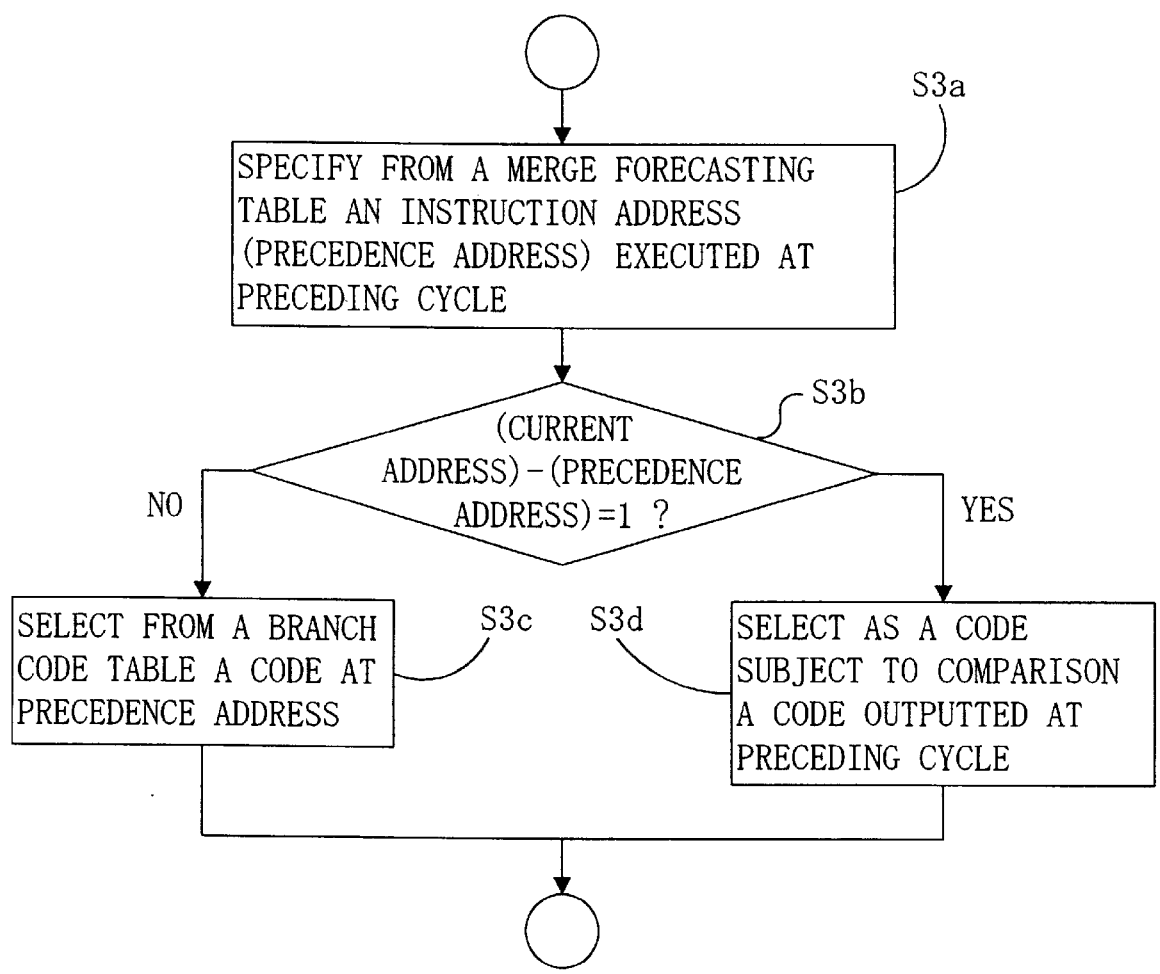
FIG. 20 is a flowchart diagram showing processes of step S3 of the FIG. 19 flowchart diagram.

The operation of the FIG. 18 object code generator is described by referring to FIGS. 19 and 20.

At step S1, the program analysis section 14 analyzes the flow of an assembler program described in the assembler text file 31a. For example, in the FIG. 17 program, the program analysis section 14 analyzes such an execution order of instructions that (i) INSTRUCTION at ADDRESS #401 is executed after INSTRUCTION at ADDRESS #400 or after INSTRUCTION at ADDRESS #404, (ii) INSTRUCTION at ADDRESS #402 is executed after INSTRUCTION at ADDRESS #401, and (iii) INSTRUCTION at ADDRESS #405 is executed after INSTRUCTION at ADDRESS #402. The result of the analysis operation by the program analysis section 14 is stored in the merge forecasting table 15a.

FIG. 21(a) shows a merge forecasting table 15a for the FIG. 17 assembler program. Portions, indicated with oblique lines in FIG. 21(a), may be omitted, taking the precedence address=(the current address−1).

Thereafter, steps S2 to S5 are repeated until the assembler program is finished.

At step S2, the code generation section 11 inputs from the assembler program a single instruction and outputs all object codes allocated to the input instruction. Suppose here that object codes at from ADDRESS #400 up to ADDRESS #404 have already been outputted and that an object code at ADDRESS #405 is outputted.

At step S3, the CCSS 15c selects either an object code outputted from the code output section 13 or an object code stored in the branch code table 15b, according to the information of the merge forecasting table 15a, and outputs the code thus selected to the comparison section 12a as a comparison target code.

FIG. 20 flow-charts the processing of step S3. At step S3a, an instruction address (precedence address) that is executed at the preceding cycle, is specified from the merge forecasting table 15a. At step S3b, a difference between the current address and the precedence address is found. If the difference is not one, then at step S3c a code of the precedence address is selected from the branch code table 15b. If the difference is one, then at step S3d a code, outputted at the preceding cycle, is selected as a code subjected to comparison.

FIG. 21(b) shows a branch code table 15b for the FIG. 17 assembler program. Codes at ADDRESSES #402 and #404 are stored in the branch code table 15b.

At this time, the merge forecasting table 15a stores information informing that INSTRUCTION at ADDRESS #405 is to be executed after INSTRUCTION at ADDRESS #402. The branch code table 15a further stores an object code for INSTRUCTION at ADDRESS #402. The CCSS 15d selects between the object code for INSTRUCTION at ADDRESS #404 that is temporarily held in the code output section 13 and the object code for INSTRUCTION at ADDRESS #402 that is stored in the branch code table 15b. Based on the information stored in the merge forecasting table 15a, the CCSS 15d selects the latter object code for forwarding to the comparison section 12a.

At step S4, the comparison section 12a makes a comparison between a comparison target code from the CCSS 15c and each of all object codes for INSTRUCTION at ADDRESS #405, to calculate respective PIB counts.

At step S5, the decision section 12b determines an object code with the lowest PIB count. Based on the decision result by the decision section 12b, the selection section 12c selects, from among all the object codes for INSTRUCTION at ADDRESS #405 outputted from the code generation section 11, an object code with the lowest PIB count. The object code thus selected is written by the code output section 13 into the object file 32a.

Step S6 determines whether every instruction of the assembler program is coded to an object code. If all the instructions of the assembler program have been coded, the processing ends. If not, the processing returns back to step S2.

In accordance with the present object code generator, a program flow is analyzed so as to determine an execution order of instructions, and, according to the instruction execution order thus determined, an object code with the minimum PIB count is selected. Such arrangement is able to further reduce the number of PI occurrences in the instruction bus of the digital signal processor.

EMBODIMENT 4

Figure 22:
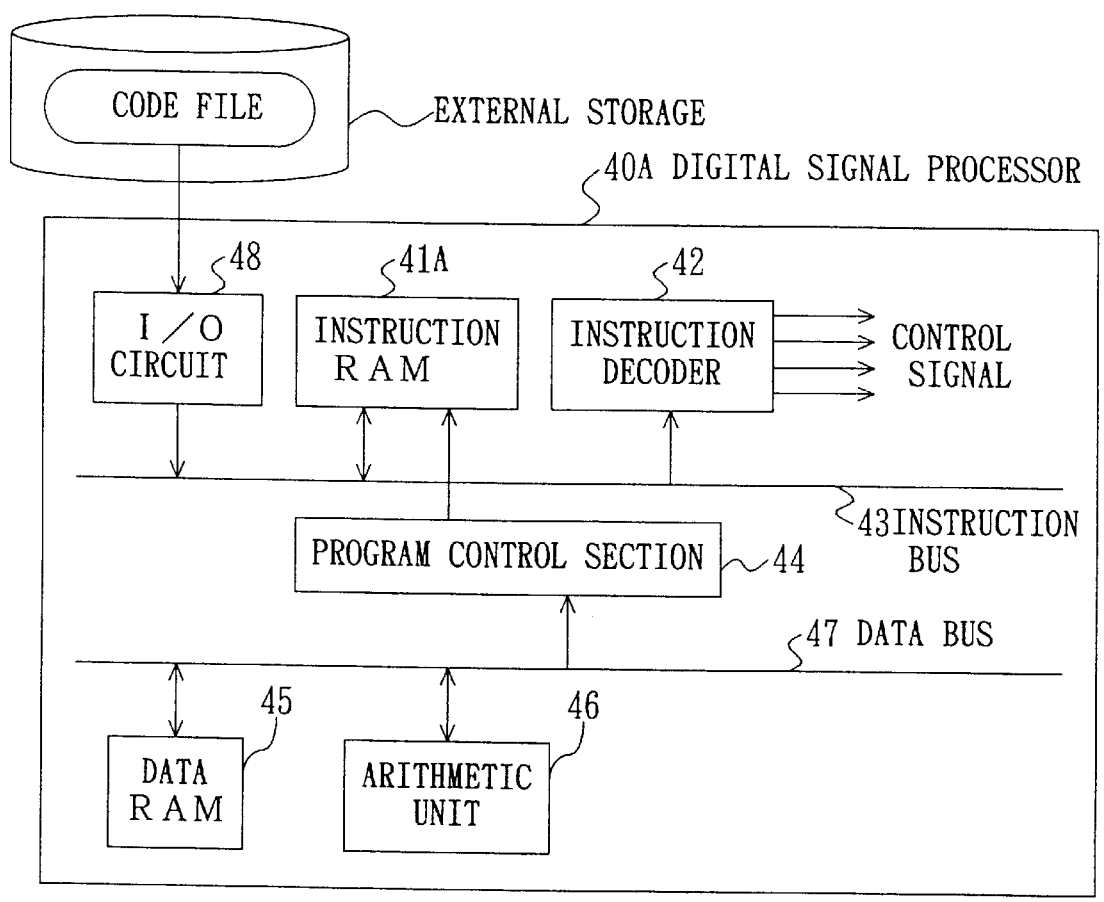
FIG. 22 is a block diagram showing a structure of a digital signal processor made in accordance with a fourth embodiment of the present invention.

FIG. 22 is a block diagram showing a structure of a digital signal processor made in accordance with a fourth embodiment of the present invention. 41A is an instruction RAM serving as an instruction memory. 42 is an instruction decoder. 43 is an instruction bus. 44 is a program control section. 45 is a data RAM. 46 is an arithmetic unit. 47 is a data bus. 48 is an output/input circuit.

The digital signal processor, shown in FIG. 22, is a note-type PC, a PDA (personal digital assistant) or the like, and the external storage is a flash memory or a hard disk.

Before the signal processing starts, object codes stored in the code file are written into the instruction RAM 41A via the I/O circuit 48 and instruction bus 43. The object codes are formed so as to minimize the number of PI occurrences in the instruction bus 43 and are outputs from the object code generator of the second embodiment, in the present embodiment. The instruction bus 43 is used for the transfer of object codes from the I/O circuit 48 to the instruction RAM 41A as well as for the transfer of object codes from the instruction RAM 41A to the instruction decoder 42.

The instruction decoder 42a analyzes an object code to be transferred and a condition flag, provides a control signal to the program control section 44, to the data RAM 45 and to the arithmetic unit 46 and sends out an access address to the data RAM 45.

The data RAM 45 is a memory for storing data. The arithmetic unit 46 contains a program counter and controls read processing from the instruction RAM 41A. The data bus 47 is used for the transfer of data between the data RAM 45 and the arithmetic unit 46 as well as for the transfer of data between the data RAM 45 and the program control section 44.

The operation of the FIG. 22 digital signal processor is described. For a program to be executed, an object code is transferred to the instruction decoder 42 from the instruction RAM 41 through the instruction bus 43. A string of object codes is formed by the object code generator such that the PIB count between object codes is minimized. As a result of such arrangement, the degree of variation in the voltage of the instruction bus 43 is reduced. The power consumption of the instruction bus 43 is decreased.

In the instruction decoder 42, a control signal is decoded from an operation part of an object code and a condition flag. FIG. 23 shows output signals from the instruction decoder 42. When the operation part is either [000] or [111], STR (write control signal) is made TRUE. When the operation part is either [001] or [110], LD (read control signal) is made TRUE. When the operation part is either [010] or [101], ADD (addition control signal) is made TRUE. When the operation part is [011], then SUB (subtraction control signal) is made TRUE. Further, if the operation part is [100] and if the condition flag is "1", then JMP (branch control signal) is made TRUE.

An access address to the data RAM 45 is decoded from an operand part of an object code. If the operand part's MSB, (a), is "0", the low-order five bits are outputted intact as an access address. If the MSB (a) is "1", a logic inversion of the low-order five bits is outputted as an access address.

Figure 24:
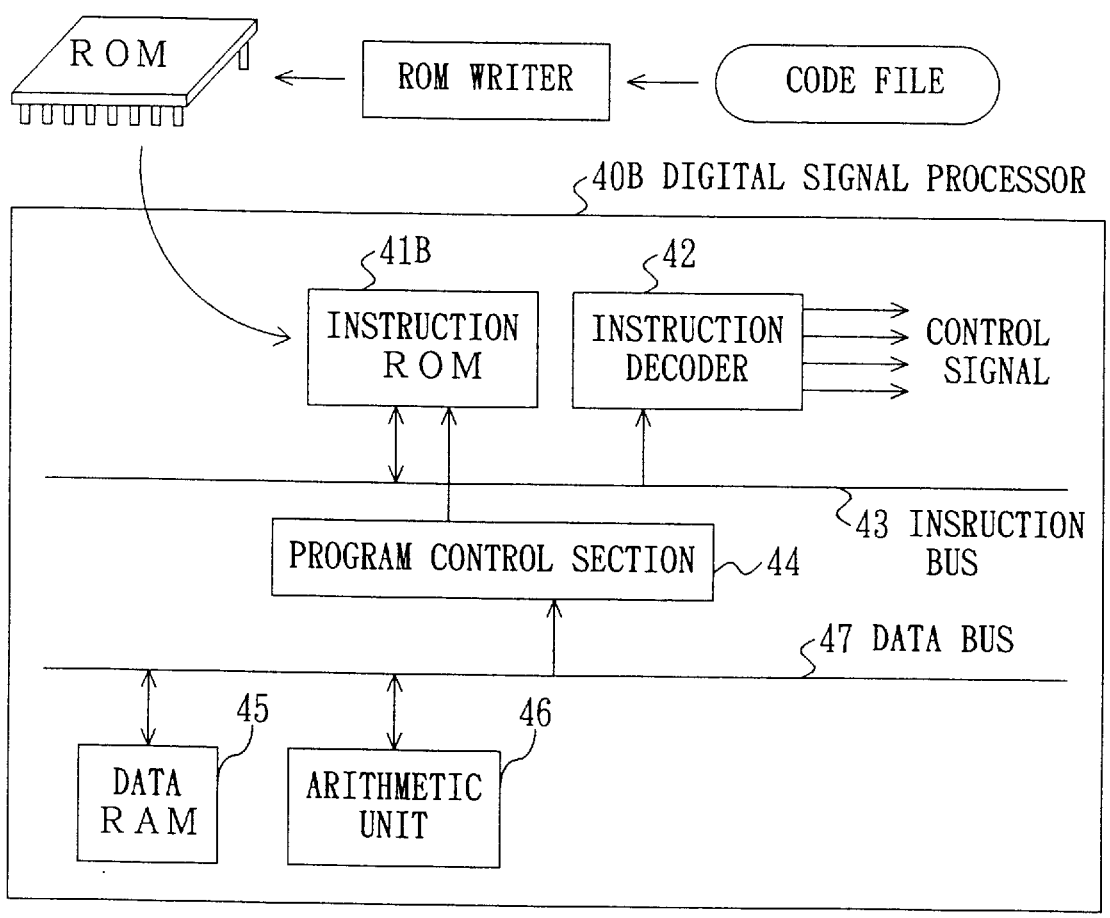
FIG. 24 is a block diagram illustrating another structure of the digital signal processor of the fourth embodiment.

FIG. 24 shows another structure of the digital signal processor according to the present embodiment. 41B is an instruction ROM serving as an instruction memory. 42 is an instruction decoder. 43 is an instruction bus. 44 is a program control section. 45 is a data RAM. 46 is an arithmetic unit. 47 is a data bus.

The digital signal processor, shown in FIG. 24, is a digital portable telephone, a video camera, a digital camera, a car navigation system, or the like.

Object codes stored in a code file are written by a ROM writer into the instruction ROM 41B. The object codes are formed such that the number of PI occurrences in the instruction bus 43 is minimized. Other structures and operations are the same as the FIG. 22 digital signal processor and their descriptions are not made here.

Even in a digital signal processor in which data codes are written into data memory so that the number of PI occurrences in a data bus is reduced to a minimum, the power consumption of the digital signal processor can be reduced, for the power consumption of the data bus is reduced.

Additionally, both in the FIG. 18 digital signal processor and in the FIG. 20 digital signal processor, if data codes, which are formed so as to minimize the number of PI occurrences, are written into the data RAM 45, the power consumption of the digital signal processor is further cut down, for the power consumption of the data bus 47 is decreased.

The invention claimed is:

1. A data transmission device comprising:
a code generator that receives a plurality of data items, assigns at least one code of a bit width equal to that of the data items for each data item and multiple different codes of the bit width equal to that of the data items for some of the data items, and outputs the codes for processing by a processor; and
said processor receives the codes from said code generator, converts the codes into data, and processes the data, said processor having a bus that carries said codes;
wherein, for each data item that the code generator assigns multiple codes, said code generator selects one of said multiple codes so that the number of polarity inversions occurring in said bus of said processor is minimized and outputs said selected code for that data item; and
wherein said processor has a decoder which interprets all codes assigned by said code generator for a data item as said data item.

2. A data transmission device according to claim 1 wherein said data items are instructions of a program that are processed by said processor and wherein said codes are object codes that represent said instructions.

3. A data transmission device according to claim 1, said code generator including:

(a) a code generation section that assigns the codes;
(b) a code selection section wherein,
when said code generation section assigns only one code for a data item, said code selection section selects said code, and,
when said code generation section multiple codes to a data item, said code selection section compares (A) a code that is transferred just before or after any one of said multiple codes with (B) each of said multiple codes, calculates respective polarity-inverting bit counts which are the number of bits of each of the multiple codes that are of an opposite polarity to the corresponding bits of said code (A), and selects a one of the multiple codes that has the lowest polarity-inverting bit count; and
(c) a code output section that outputs said code selected by said code selection section.

4. A data transmission device according to claim 3, said code selection section including:
(a) a comparison section wherein,
when said code generation section assigns multiple codes for a data item, said comparison section compares (A) a code that is transferred just before or after any one of said multiple codes with (B) each of said multiple codes, and calculates the respective polarity-inverting bit counts;
(b) a decision section that determines which of the multiple codes results in a lowest polarity-inverting bit count; and
(c) a selection section wherein,
when said code generation section assigns only one code for a data item, said selection section selects said code, and,
when said code generation section assigns multiple codes for a data item, said selection section selects a code according to the result of said determination by said decision section.

5. A data transmission device according to claim 1, said code generator including:
(a) a code generation section,
said code generation section assigns at least one code for each data item, and
said code generation section allocates all codes, and
said code generation section provides code strings of all combinations of codes for a plurality of data items;
(b) a code selection section wherein,
when said code generation section provides only one code string, said code selection section selects said code string, and,
when said code generation section provides a plurality of code strings, said code selection section calculates respective polarity-inverting bit counts which are the number of times a bit line of said bus of said processor makes a polarity inversion when each of said plurality of code strings is transferred over said bus of said processor, and selects a code string with the lowest polarity-inverting bit count; and
(c) a code output section that outputs said code string selected by said code selection section.

6. A data transmission device according to claim 1, wherein said code generator assigns a larger number of codes for data items that occur at a high frequency than for data items that occur at a low frequency.

7. A data transmission device according to claim 1 wherein said code generator assigns two codes for at least one of the data items, and said two codes are generated by adding, to a first bit string and to a second bit string obtained by processing said first bit string, one bit indicative of whether each bit string has been processed.

8. A data transmission device according to claim 1 wherein said bus of said processor is a precharge type bus so that, after a code is transferred and before a following code is output, all bit lines of said bus are brought to "1", and wherein said code generator selects, when multiple codes are assigned for a data item, a one of said multiple codes that contains a maximum number of "1"s.

9. A data transmission device according to claim 1, wherein each code is composed of a given number of bits, and said code generator assigns a different one of the codes for each of the data items and assigns at least one of the codes remaining unassigned for some one of the data items.

10. A data transmission method, for converting input data items into codes and transmitting said codes to a processor, wherein at least one code of a bit width equal to that of the input data items is assigned for each input data item and multiple different codes of the bit width equal to that of the input data items are assigned for some of the data items, and wherein said processor has a bus for code transfer and a decoder which interprets all codes assigned for said input data item as said input data item, said data transmission method comprising:

a code generation step of generating the codes assigned for each input data item; and a code selection step of selecting, when multiple codes are assigned for an input data item, one of said multiple codes so that a number of polarity-inversion occurrences in said bus of said processor is minimized.

11. A data transmission method according to claim 10, said code selection step including:

when multiple codes are assigned for a data item, a comparison between (A) a code that is transferred just before or after any one of said multiple codes and (B) each of said multiple codes, to calculate respective polarity-inverting bit counts which are the number of bits of each of the multiple codes that are of an opposite polarity to the corresponding bits of said code (A) and select a one of the multiple codes that has the lowest polarity-inverting bit count.

12. A data transmission method according to claim 10, wherein a larger number of codes are assigned for data items that occur at a high frequency than for data items that occur at a low frequency.

13. A data transmission method according to claim 10 wherein two codes are assigned for at least one of the data items, and said two codes are generated by adding, to a first bit string and to a second bit string obtained by processing said first bit string, one bit indicative of whether each said bit string has been processed.

14. A data transmission method according to claim 10 wherein said bus of said processor is a precharge type bus so that, after a code is transferred and before a following code is output, all bit lines of said bus are brought to"1", and wherein said code selected step includes selecting, when multiple codes are assigned for a data item, a one of said multiple codes that contains a maximum number of "1"s.

15. A data transmission method according to claim 10, wherein each of the codes is composed of a given number of bits, a different one of the codes is assigned for each input data item and at least one of the codes remaining unassigned is assigned for some one of the input data items.

16. A data transmission device comprising:

a code generator that receives data items, assigns at least one code for each data item and multiple different codes of the same number of bits for some of the data items, and outputs the codes for processing by a processor; and said processor receives the codes from said code generator, converts the codes into data, and processes the data, said processor having a bus that carries said codes;

wherein, for each data item that the code generator assigns multiple codes, said code generator selects one of said multiple codes so that the number of polarity inversions occurring in said bus of said processor is maximized and outputs said selected code for that data item; and wherein said processor has a decoder which interprets all codes assigned by said code generator for a data item as said data item.

17. A data transmission method, for converting input data items into codes and transmitting said codes to a processor, wherein at least one code is assigned for each input data item and multiple different codes are assigned for some of the data items, and wherein said processor has a bus for code transfer and a decoder which interprets all codes assigned for said input data item as said input data item, said data transmission method comprising:

a code generation step of generating the codes assigned for each input data item; and a code selection step of selecting, when multiple codes are assigned for an input data item, one of said multiple codes so that a number of polarity-inversion occurrences in said bus of said processor is maximized.

18. An object code generator for converting a plurality of instructions of a program that is processed by a processor, each into an object code of a bit width equal to that of the instructions, said processor having:

an instruction bus for object code transfer;

an instruction decoder which interprets all object codes provided by said object code generator for an instruction as said instruction;

wherein:

a plurality of different object codes are provided for at least one of said instructions of said program that is executed by said processor;

when a plurality of object codes are provided for an instruction, an object code is selected from among said plurality of object codes so that the number of polarity-inversion occurrences in said instruction bus of said processor is minimized.

19. An object code generator according to claim 18, said object code generator comprising:

(a) a program analysis section which analyzes an execution order of the instructions of a program;

(b) a code generation section which generates all object codes provided for each of said instructions of said program;

(c) a comparison target code selection section wherein, when a plurality of object codes are provided for an instruction, said comparison target code selection section selects, as a comparison target code, an object code immediately before any one of said plurality of object codes according to said analyzed instruction execution order;

(d) a code selection section wherein, when said code generation section provides only one object code for an instruction, said code selection section selects said one object code, and, when said code generation section provides a plurality of object codes for an instruction, said code selection section compares said comparison target code with each of said plurality of object codes, calculates respective polarity-inverting bit counts which are the number of bits of each of said plurality of object codes that are of an opposite polarity to the corresponding bits of said comparison target code, and selects an object code from among said plurality of object codes that has the lowest polarity-inverting bit count; and (e) a code output section which outputs said object code selected by said code selection section.

20. An object code generator according to claim 19, said code selection section including:

(a) a comparison section wherein, when said code generation section provides a plurality of object codes for an instruction, said comparison section compares each of said plurality of object codes with said comparison target code, and calculates respective polarity-inverting bit counts;

(b) a decision section that determines, based on the result of said calculation by said comparison section, an object code with the lowest polarity-inverting bit count from among said plurality of object codes;

(c) a selection section wherein, when said code generation section provides only one object code for an instruction, said selection section selects said one object code, and, when said code generation section provides a plurality of object codes for an instruction, said selection section selects an object code according to the result of said determination by said decision section.

21. An object code generator according to claim 18, wherein each of the object codes is composed of a given number of bits, and said object code generator assigns a different one of the object codes for each of the instructions and assigns for some one of the instructions at least one of the object codes remaining unassigned.

22. A processor, comprising:

a data memory for storing data codes;

a data bus for the transfer of said data codes;

a data decoder for interpreting a data item indicated by each of said data codes transferred over said data bus, each of the data codes being of a bit width equal to that of the corresponding data item;

an instruction memory for storing object codes;

an instruction bus for the transfer of said object codes; and an instruction decoder for interpreting an instruction indicated by each of said object codes transferred over said instruction bus;

said processor processing said data items interpreted by said data decoder;

said processor executing said instructions interpreted by said instruction decoder;

wherein:

a plurality of different data codes are provided for at least one of the data items and a plurality of object codes are provided for at least one of the instructions;

when a plurality of data codes are provided for a data item, said data memory stores one data code selected from among said plurality of data codes such that the number of bit line polarity-inversion occurrences in said data bus is minimized;

said data decoder interprets said plurality of data codes provided for said data item as said data item;

when a plurality of object codes are provided for an instruction, said data memory stores one object code selected from among said plurality of object codes such that the number of bit line polarity-inversion occurrences in said data bus is minimized; and said data decoder interprets said plurality of object codes provided for said instruction as said instruction.

23. A processor according to claim 22, wherein each of the data codes is composed of a given number of bits, a different one of the data codes is assigned for each of the data items, at least one of the data codes remaining unassigned is assigned for some one of the data items, each of the object codes is composed of a given number of bits, a different one of the object codes is assigned for each of the instructions, and at least one of the object codes remaining unassigned is assigned for some one of the instructions.

24. An object code generation method for converting a plurality of instructions of a program that is executed by a processor, each into an object code of a bit width equal to that of the instructions, wherein a plurality of different object codes are provided for at least one of said instructions of said program that is executed by said processor, and wherein said processor has an instruction bus for object code transfer and an instruction decoder which interprets all object codes provided for an instruction as said instruction, said object code generation method comprising:

(a) a program analysis step of analyzing an execution order the instructions;

(b) a code generation step of generating all object codes provided for each instruction;

(c) a comparison target code selection step of selecting, when a plurality of object codes are generated for an instruction in said code generation step, an object code immediately before any one of said plurality of object codes according to said analyzed instruction execution order as a comparison target code;

(d) a polarity-inverting bit count calculation step of making, when a plurality of object codes are generated for an instruction in said code generation step, a comparison between said comparison target code and each of said plurality of object codes, calculating respective polarity-inverting bit counts which are the number of bits of each of said plurality of object codes of opposite polarity to corresponding bits of said comparison target code, and selecting an object code from among said plurality of object codes that has the lowest polarity-inverting bit count; and (e) a code selection step of selecting, when only one object code is generated for an instruction in said code generation step, said one object code, and of selecting, when a plurality of object codes are generated for an instruction in said code generation step, an object code according to the result of said polarity-inverting bit count calculation step.

25. An object code generation method according to claim 24, wherein each of the object codes is composed of a given number of bits, a different one of the object codes is assigned for each of the instructions, and at least one of the object codes remaining unassigned is assigned for some one of the instructions.

26. A processor, comprising:

a data memory for storing data codes;

a data bus for the transfer of said data codes; and a data decoder for interpreting a data item indicated by each of said data codes transferred over said data bus, each of the data codes being of a bit width equal to that of the corresponding data item;

said processor processing said data items interpreted by said data decoder;

wherein:

a plurality of different data codes are provided for at least one of the data items;

when a plurality of data codes are provided for a data item, said data memory stores one data code selected from among said plurality of data codes such that the number of bit line polarity-inversion occurrences in said data bus is minimized; and said data decoder interprets said plurality of data codes provided for said data item as said data item.

27. A processor according to claim 26, wherein each of the data codes is composed of a given number of bits, a different one of the data codes is assigned for each of the data items, and at least one of the data codes remaining unassigned is assigned for some one of the data items.

28. A processor, comprising:

an instruction memory for storing object codes;

an instruction bus for object code transfer; and an instruction decoder for interpreting an instruction indicated by each of said object codes transferred over said instruction bus, each of the object codes being of a bit width equal to that of the corresponding data item;

said processor executing said instructions interpreted by said data decoder;

wherein:

a plurality of different object codes are provided for at least one of the instructions;

when a plurality of object codes are provided for an instruction, said data memory stores one object code selected from among said plurality of object codes such that the number of bit line polarity-inversion occurrences in said data bus is minimized; and said data decoder interprets said plurality of object codes provided for said instruction as said instruction.

29. A processor according to claim 28, wherein each of the object codes is composed of a given number of bits, a different one of the object codes is assigned for each of the instructions, and at least one of the object codes remaining unassigned is assigned for some one of the instructions.

30. A code generator for converting input data items into codes, each of a bit width equal to that of the data items, and for outputting said codes, said code generator providing a plurality of different codes for at least one of said input data items, and said code generator selecting, when a plurality of codes are provided for an input data item, one code from among said plurality of codes so that the number of bit line polarity-inversion occurrences in a bus of a processor which processes said input data item is minimized.

31. A code generator according to claim 30, said code generator including:

(a) a code generation section that generates said codes;

(b) a code selection section wherein, when said code generation section provides only one code for an input data item, said code selection section selects said one code, and, when said code generation section provides a plurality of codes for an input data item, said code selection section compares (A) a code that is transferred just before or after any one of said plurality of codes with (B) each of said plurality of codes, calculates respective polarity-inverting bit counts which are the number of bits of each said code (B) that are of an opposite polarity to the corresponding bits of said code (A), and selects one code from among said plurality of codes that has the lowest polarity-inverting bit count; and (c) a code output section that outputs said code selected by said code selection section.

32. A code generator according to claim 30, said code generator including:

(a) a code generation section that generates said codes, said code generation section providing code strings of all combinations of codes for a plurality of items of data;

(b) a code selection section wherein, when said code generation section provides only one code string, said code selection section selects said one code string, and, when said code generation section provides a plurality of code strings, said code selection section calculates respective polarity-inverting bit counts which are the number of times a bit line of said bus of said processor makes a polarity inversion when each of said plurality of code strings is transferred over said bus of said processor, and selects a code string with the lowest polarity-inverting bit count; and (c) a code output section that outputs said code string selected by said code selection section.

33. A code generator according to claim 30, wherein each of the codes is composed of a given number of bits, and said code generator assigns a different one of the codes for each of the input data items and assigns for some one of the input data items at least one of the codes remaining unassigned.

34. A code generation method, for converting input data items into codes, each of a bit width equal to that of the data items, wherein:

a plurality of different codes are provided for at least one of said input data items;

when a plurality of codes are prepared for an input data item, one code is selected from among said plurality of codes so that the number of polarity-inversion occurrences in a bus of a processor that processes said input data item is minimized.

35. A code generation method according to claim 34, said code generation method comprising:

a code generation step of generating all codes provided for each input data item; and a code selection step of selecting, when a plurality of codes are generated for an input data item in said code generation step, one code from among said plurality of codes so that the number of polarity-inversion occurrences in said bus of said processor that processes said input data item is minimized.

36. A code generation method according to claim 35, said code selection step including, when a plurality of codes are generated for an input data item in said code generation step, making a comparison between (A) a code that is transferred just before or after any one of said plurality of codes and (B) each of said plurality of codes, calculating respective polarity-inverting bit counts which are the number of bits of each said code (B) that are of an opposite polarity to corresponding bits of said code (A), and selecting one code from among said plurality of codes that has the lowest polarity-inverting bit count.

37. A code generation method according to claim 34, said code generation method including:

a code generation step of allocating all codes provided for said input data items and generating code strings of all combinations of codes for a plurality of input data items; and a code selection step of selecting, when a plurality of code strings are generated in said code generation step, a code string from among said plurality of code strings so that the number of polarity-inversion occurrences in said bus of said processor is minimized.

38. A code generation method according to claim 34 wherein said input data items are instructions of a program that is processed by said processor, and wherein said codes are object codes that represent instructions of a program processed by said processor.

39. A code generation method according to claim 34, wherein each of the codes is composed of a given number of bits, a different one of the codes is assigned for each of the input data items, and at least one of the codes remaining unassigned is assigned for some one of the input data items.

40. An object code generator, comprising:
a code generator that receives instructions, assigns at least one code for each instruction and multiple different codes for some of the instructions, and outputs the codes for processing by a processor; and
wherein, for each instruction that the code generator assigns multiple codes, said code generator selects one of said multiple codes so that the number of polarity inversions occurring in a bus of said processor is maximized and outputs said selected code for that instruction.

41. A processor, comprising:
a code generator that receives data items, assigns at least one code to each data item and multiple different codes for some of the data items, and outputs the codes for processing by said processor; and
said processor receives the codes from said code generator, converts the codes into data, and processes the data, said processor having a bus that carries said codes;
wherein, for each data item that the code generator assigns multiple codes, said code generator selects one of said multiple codes so that the number of polarity inversions occurring in said bus of said processor is maximized and outputs said selected code for that data item; and
wherein said processor has a decoder which interprets all codes assigned by said code generator for a data item as said data item.

42. A code generator, that receives data items, assigns at least one code for each data item and multiple different codes for some data items, and outputs the codes for processing by a processor; and
wherein, for each data item that the code generator assigns multiple codes, said code generator selects one of said multiple codes so that the number of polarity inversions occurring in a bus of said processor is maximized and outputs said selected code for that data item.

43. An object code generation method, for converting instructions into codes, and some of the instructions into multiple different codes, and transmitting said codes to a processor, wherein at least one code is assigned to each instruction, and wherein said processor has a bus for code transfer and a decoder which interprets all codes assigned to said instruction as said instruction, said data transmission method comprising:
a code generation step of generating the codes assigned to each instruction; and
a code selection step of selecting, when multiple codes are assigned to an instruction, one of said multiple codes so that a number of polarity-inversion occurrences in said bus of said processor is maximized.

44. A code generation method, for converting input data items into codes, and some data items into multiple different codes, and transmitting said codes to a processor, wherein at least one code is assigned to each input data item, and wherein said processor has a bus for code transfer and a decoder which interprets all codes assigned to said input data item as said input data item, said data transmission method comprising:
a code generation step of generating the codes assigned to each input data item; and
a code selection step of selecting, when multiple codes are assigned to an input data item, one of said multiple codes so that a number of polarity-inversion occurrences in said bus of said processor is maximized.

* * * * *